(12) United States Patent
Chang

(10) Patent No.: US 11,693,437 B1
(45) Date of Patent: Jul. 4, 2023

(54) ELECTRONIC DEVICE

(71) Applicant: Qisda Corporation, Taoyuan (TW)

(72) Inventor: Chih-Ming Chang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/715,206

(22) Filed: Apr. 7, 2022

(30) Foreign Application Priority Data

Feb. 23, 2022 (CN) .......................... 202210168127.9

(51) Int. Cl.
| | |
|---|---|
| *G05F 1/56* | (2006.01) |
| *H02M 3/155* | (2006.01) |
| *H03K 3/037* | (2006.01) |
| *H02M 1/36* | (2007.01) |
| *B60R 25/40* | (2013.01) |
| *B60L 53/20* | (2019.01) |

(52) U.S. Cl.
CPC .............. *G05F 1/56* (2013.01); *H02M 1/36* (2013.01); *H02M 3/155* (2013.01); *H03K 3/037* (2013.01); *B60L 53/20* (2019.02); *B60L 2210/10* (2013.01); *B60R 25/40* (2013.01)

(58) Field of Classification Search
None
See application file for complete search history.

(56) References Cited

U.S. PATENT DOCUMENTS 10,800,264 B2 * 10/2020 Liu ...................... G05D 1/0088
2020/0212802 A1 * 7/2020 Chang ...................... H02J 7/34

* cited by examiner

*Primary Examiner* — Jeffery S Zweizig

(57) ABSTRACT

The disclosure provides an electronic device. The electronic includes an internal battery, a first converter, a processor and a control circuit. The first converter is used to convert electrical power provided by the internal battery or provided by an external power source into a first power signal. The processor operates in an "ON-state" or switches to an "OFF-state". The control circuit is used to control the first converter, so that the first converter selectively provides the first power signal to the processor.

15 Claims, 3 Drawing Sheets

ELECTRONIC DEVICE

This application claims the benefit of People's Republic of China application Serial No. 202210168127.9, filed Feb. 23, 2022, the subject matter of which is incorporated herein by reference.

TECHNICAL FIELD

The disclosure relates to an electronic device, and more particularly, to a vehicle electronic device with a power control mechanism for driving record and monitoring.

BACKGROUND

With the development of the automobile industry, especially in response to evolution of electric vehicles and intelligent self-driving cars, driving recorders and advanced driver assistance systems (ADAS) have been generally installed in automobiles and have almost become essential specifications. The power source of the driving recorder and the ADAS mainly comes from the car battery, that is, the car battery is used as the external power source of the driving recorder and the ADAS. When the car parks and the engine stops running, the car battery may not be charged, hence the driving recorder and ADAS may exhaust the car battery.

Although some driving recorders and ADAS may be provided with an internal battery, however, the internal battery cannot unlimitedly provide power. Moreover, due to arrangement of the internal battery, power control circuit of the driving recorder and ADAS may have greater complexity.

Therefore, those skilled in related industries of the technical field are devoted to improve power control circuit and control mechanism of the driving recorder and the ADAS.

SUMMARY

To address to the above-mentioned technical problems of the prior art, technical solutions of the present disclosure are directed to an electronic device, which may make the processor adaptively operate in an ON-state or switch to an OFF-state according to how the internal battery and the external power supply provide power.

In the technical solutions of the present disclosure, an electronic device is provided. The electronic device comprises an internal battery, a first converter and a processor. The first converter is used for converting an electrical power provided by the internal battery or an electrical power provided by an external power source into a first power signal. The processor operates in an ON-state or switching to an OFF-state according to the first power signal. The control circuit is used for controlling the first converter to make the first converter selectively provide the first power signal to the processor.

According to the above technical solutions, the processor of the electronic device of the present disclosure may be adaptively operated in an ON-state or switched to an OFF-state, which may effectively prevent the external power source from being exhausted when the engine stops running. In addition, with the control signal and the enable signal, the time point at which the processor's boot procedure and shut-down procedure are executed, may be precisely controlled.

Figure 1:
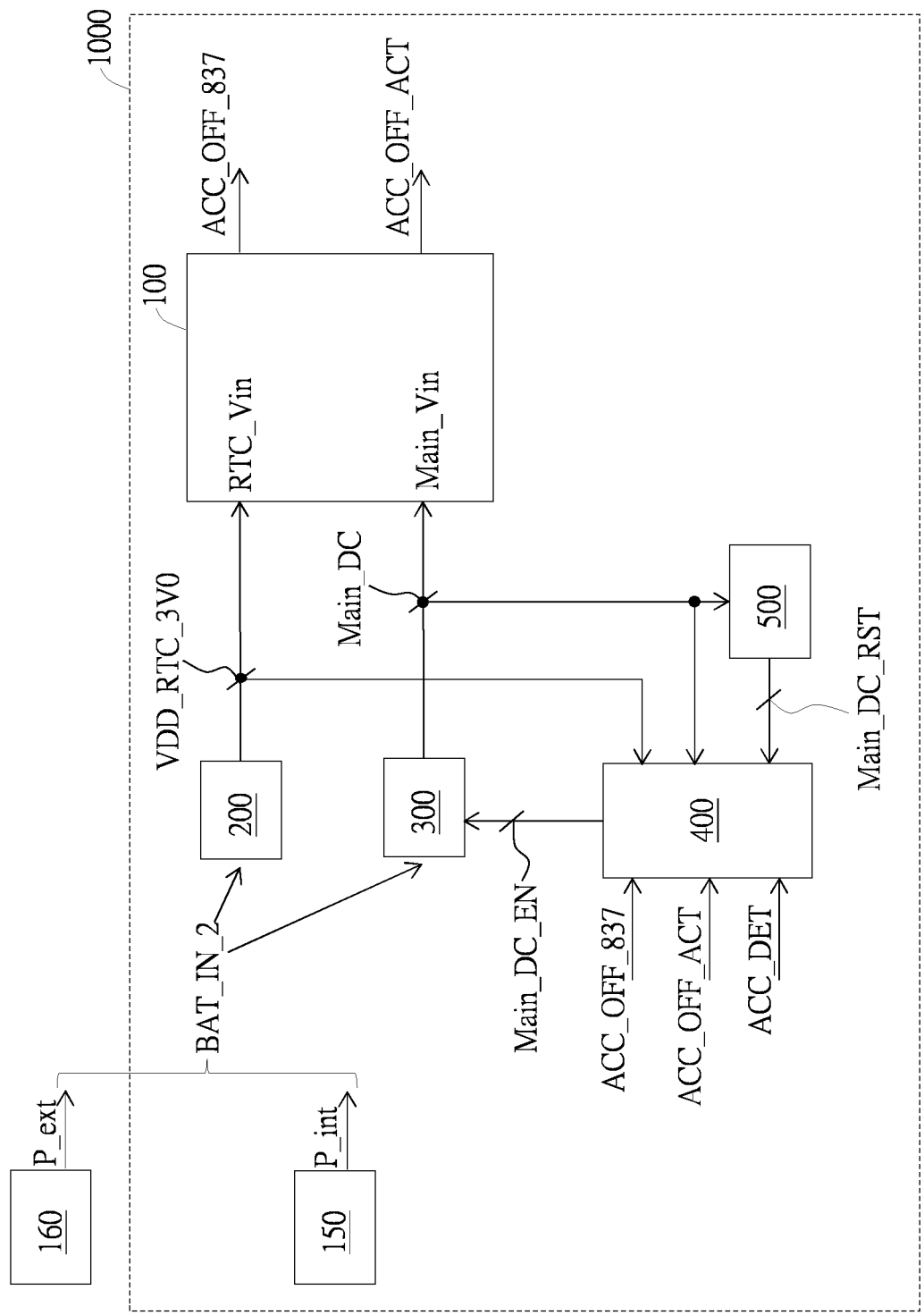
FIG. 1 is a partial circuit diagram of an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a partial circuit diagram of an electronic device 1000 according to an embodiment of the disclosure. The electronic device 1000 is, for example, a recorder or an advanced driver assistance system (ADAS). The electronic device 1000 is used to perform driving recording or assist driving when the car is running, and may perform anti-theft or anti-collision recoding and warning when the car is parked and turned-off. The components of the electronic device 1000 that perform image capturing, photographing and video recording functions are not shown in FIG. 1. Referring to FIG. 1, the electronic device 1000 includes a processor 100, an internal battery 150, a first converter 300, a second converter 200, a control circuit 400 and a signal generator 500. Furthermore, the electronic device 1000 may be coupled to an external power source 160.

The processor 100 is, for example, a central processing unit (CPU) or a microprocessor (MCU) for controlling the operation of the electronic device 1000. Furthermore, the processor 100 may selectively receive electrical power provided by the internal battery 150 and/or the external power source 160. The external power source 160 is, for example, a car battery disposed in the body of the car. The internal battery 150 is, for example, a rechargeable battery (e.g., a lithium battery) disposed in the electronic device 1000. When the engine of the car operates, the internal battery 150 is charged. When the car is running or when the car is parked and turned-off, the processor 100 may selectively receive the electrical power Pint provided by the internal battery 150 and/or the electrical power P_ext provided by the external power source 160. The voltage level of the electrical power Pint of the internal battery 150 is, for example, 3.7v, and the voltage level of the electrical power P_ext of the external power source 160 is, for example, 4.2v to 5v. In FIG. 1, the electrical power Pint of the internal battery 150 and the electrical power P_ext of the external power source 160 may be integrated and represented as an input power signal BAT_IN_2.

The first converter 300 is, for example, a DC-DC converter. The first converter 300 may selectively receive the electrical power Pint of the internal battery 150 or the electrical power P_ext of the external power source 160, and lower the voltage level of the electrical powers Pint or P_ext, being converted into a first power signal Main_DC. The voltage level of the first power signal Main_DC is, for example, 3.3v, and the first power signal Main_DC is provided to the input port Main_Vin of the processor 100, which may be used as the main power supply of the processor 100. The processor 100 may operate in an ON-state or switches to an OFF-state according to the first power signal Main_DC. In one example, when the first converter 300 provides the first power signal Main_DC, the processor 100 operates in an ON-state. On the contrary, when the first converter 300 does not provide the first power signal Main_DC, the processor 100 switches to the OFF-state.

On the other hand, the second converter 200 is, for example, a low dropout (LDO) DC-DC converter. Similarly, the second converter 200 may also selectively receive the electrical power Pint of the internal battery 150 or the electrical power P_ext of the external power source 160, and lower the voltage level of the electrical power Pint or the electrical power P_ext, being converted into the second power signal VDD_RTC_3V0. The voltage level of the second power signal VDD_RTC_3V0 is, for example, 3v, and the second power signal VDD_RTC_3V0 is provided to the input port RTC_Vin of the processor 100, which may be used as a secondary power supply for a real time clock (RTC) of the processor 100.

The processor 100 may provide a first control signal ACC_OFF_837 and a second control signal ACC_OFF_ACT through a general purpose input/output (GPIO) port, and the first control signal ACC_OFF_837 and the second control signal ACC_OFF_ACT may indicate the processor 100 is in the ON-state, the OFF-state, a boot procedure or a shut-down procedure. The processor 100 may control the voltage levels of the first control signal ACC_OFF_837 and the second control signal ACC_OFF_ACT in response to the ON-state, the OFF-state and the voltage level of the detection signal ACC_DET. In one example, when the processor 100 enters the ON-state and the booting procedure of the processor 100 is completed, the processor 100 may raise the first control signal ACC_OFF_837 to a high voltage level, and raise the second control signal ACC_OFF_ACT to a high voltage level. On the other hand, when the detection signal ACC_DET is lowered to a low voltage level and the second predefined period T2 elapses, the processor 100 enters into the shut-down procedure and lowers the second control signal ACC_OFF_ACT to a low voltage level. The second predefined period T2 is, for example, 2.5 seconds. When the shut-down procedure of the processor 100 is completed, the processor 100 may lower the first control signal ACC_OFF_837 to a low voltage level. To sum up, when the processor 100 is in ON-state and the boot procedure is completed, the first control signal ACC_OFF_837 and the second control signal ACC_OFF_ACT are both raised to high voltage levels. When the processor 100 enters the shut-down procedure, the second control signal ACC_OFF_ACT is lowered to a low voltage level. When the shut-down procedure of the processor 100 is completed, the first control signal ACC_OFF_837 is lowered to a low voltage level.

The control circuit 400 is used for controlling the first converter 300, so that the first converter 300 selectively provides the first power signal Main_DC to the processor 100. The control circuit 400 may provide the enable signal Main_DC_EN to control the first converter 300, when the enable signal Main_DC_EN has a high voltage level, the first converter 300 may provide the first power signal Main_DC to the processor 100. On the contrary, when the enable signal Main_DC_EN has a low voltage level, the first converter 300 does not provide the first power signal Main_DC to the processor 100. In one example, the control circuit 400 may receive the first control signal ACC_OFF_837, the second control signal ACC_OFF_ACT, the detection signal ACC_DET, the first power signal Main_DC, the second power signal VDD_RTC_3V0 and the reset signal Main_DC_RST, and the control circuit 400 controls the voltage level of the enable signal Main_DC_EN according to the above signals. For example, when the external power source 160 provides the electrical power P_ext, the detection signal ACC_DET has a high voltage level, at this time, the enable signal Main_DC_EN is raised to a high voltage level. After the shut-down procedure of the processor 100 is completed and the first predefined period T1 elapses, the enable signal Main_DC_EN is lowered to a low voltage level, and the first predefined period T1 is, for example, 100 ms (milliseconds). In an example, the control circuit 400 may adjust the enable signal Main_DC_EN according to the first control signal ACC_OFF_837, when the first control signal ACC_OFF_837 is lowered to a low voltage level and the first predefined period T1 elapses, the control circuit 400 adjusts the enable signal Main_DC_EN to low voltage level.

The signal generator 500 is configured to generate the reset signal Main_DC_RST according to the first power signal Main_DC, and provide the reset signal Main_DC_RST to the control circuit 400. The control circuit 400 may adjust the enable signal Main_DC_EN to a high voltage level according to a rising edge of the reset signal Main_DC_RST.

Figure 2:
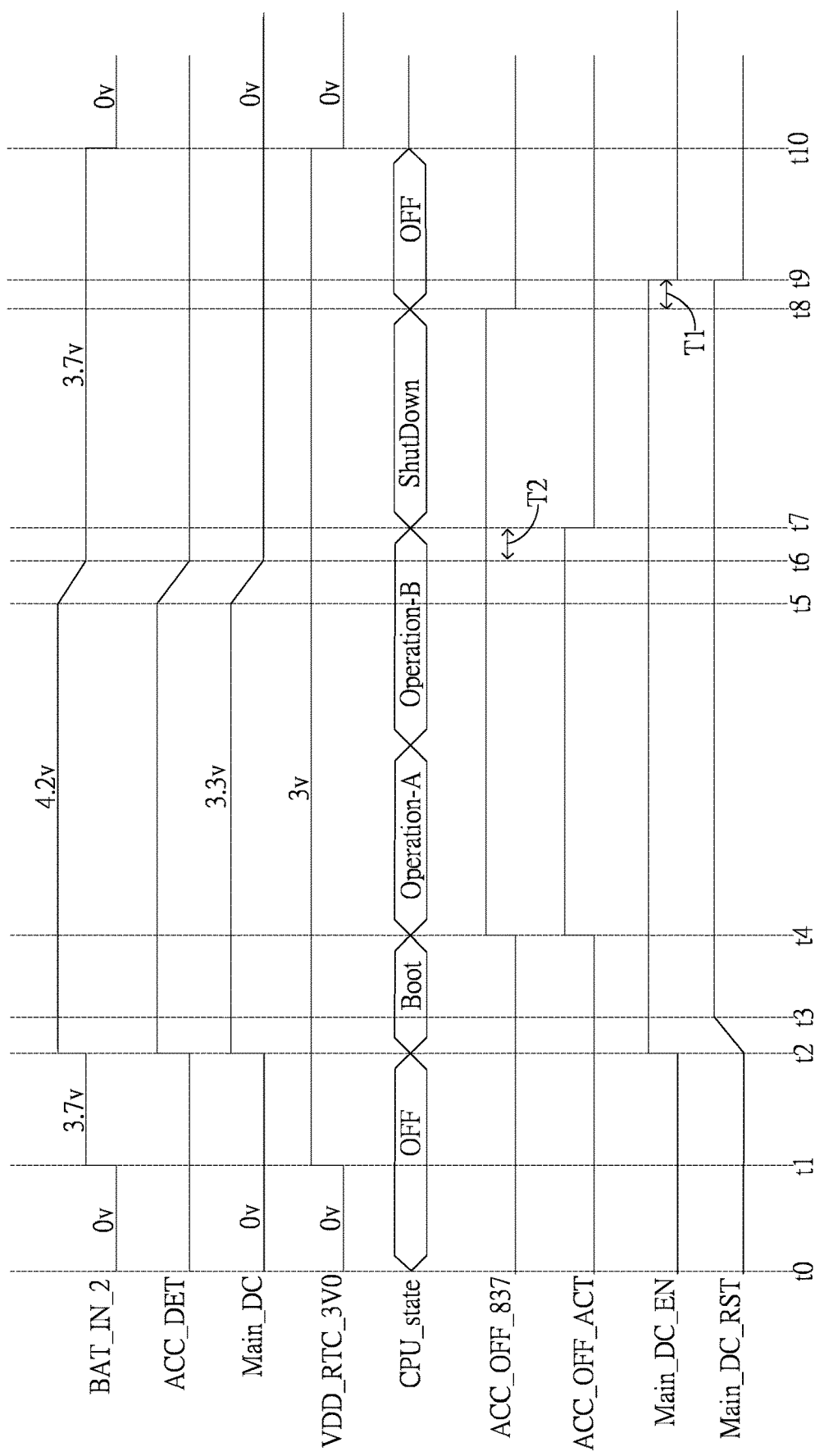
FIG. 2 is a timing diagram illustrating voltage level of each control signal of the electronic device and operating states of the processor according to an embodiment of the disclosure.

FIG. 2 is a timing diagram illustrating voltage level of each control signal of the electronic device 1000 and operating states of the processor 100 according to an embodiment of the disclosure. Referring to FIG. 2 (and also referring to FIG. 1), between the time point t0 and the time point t1, neither the internal battery 150 nor the external power source 160 supplies power (i.e., the internal battery 150 does not provide electrical power P_int, and the external power source 160 does not provide electrical power P_ext), at this time, the voltage level of the input power signal BAT_IN_2 is zero volts (0v). Furthermore, between the time point t0 and the time point t2, the processor 100 is in the OFF-state (CPU_state is "OFF").

At the time point t1, the internal battery 150 starts to provide the electrical power P_int, and the input power signal BAT_IN_2 is raised to 3.7v at this time (3.7v is the voltage level of the electrical power P_int). The second converter 200 may convert the electrical power P_int of the internal battery 150 into the second power signal VDD_RTC_3V0. Therefore, at the time point t1, the second power signal VDD_RTC_3V0 is raised to 3v. At this time, the second power signal VDD_RTC_3V0 is provided to the processor 100 through the input port RTC_Vin as a secondary power supply for the real-time clock of the processor 100.

Then, at the time point t2, the external battery 160 starts to provide the electrical power P_ext, and the input power signal BAT_IN_2 is raised to 4.2v at this time (4.2v is the voltage level of the electrical power P_ext). The first converter 300 may convert the electrical power P_ext of the external battery 160 into the first power signal Main_DC, so the first power signal Main_DC is raised to 3.3v at the time point t2. At this time, the first power signal Main_DC is provided to the processor 100 through the input port Main_Vin to serve as the main power supply of the processor 100. And, the processor 100 detects that the external battery 160 starts to provide the electrical power P_ext, hence the detection signal ACC_DET is raised to a high voltage level at the time point t2. In one example, the processor 100 may monitor the key start switch of the car, and if it is detected that the key start switch is activated, indicating that the external battery 160 starts to provide the electrical power P_ext, the detection signal ACC_DET is raised to a high voltage level. At the time point t2, the reset signal Main_DC_RST starts to raise from the low voltage level, and in response to the rising edge of the reset signal Main_DC_RST the enable signal Main_DC_EN is raised to the high voltage level at the time point t2. Then, the processor 100 enters the boot procedure (CPU_state is "Boot").

At the time point t4, the processor 100 has completed the boot procedure, so after the time point t4, the processor 100 starts to operate to perform different functions, such as a first function ("Operation-A") and a second function ("Operation-B"). In addition, the processor 100 raises the first control signal ACC_OFF_837 and the second control signal ACC_OFF_ACT to a high voltage level at the time point t4, indicating that the processor 100 starts to operate.

When the processor 100 is operating, the external power source 160 is turned off at time point t5 without providing the electrical power P_ext, hence the first power signal Main_DC is lowered to a low voltage level. The processor 100 detects that the external power source 160 does not provide the electrical power P_ext, hence the detection signal ACC_DET also starts to lower at the time point t5 until the detection signal ACC_DET drops to the low voltage level at the time point t6. The detection signal ACC_DET drops to a low voltage level at the time point t6 and the second predefined period T2 has elapsed. It may be confirmed that the external power source 160 is completely turned off, and the processor 100 enters the shut-down procedure at the time point t7 after the second predefined period T2. The processor 100 lowers the second control signal ACC_OFF_ACT to a low voltage level (indicating that the processor 100 enters the shut-down procedure).

Then, at the time point t8, the processor 100 has completed the shut-down procedure, and the processor 100 lowers the first control signal ACC_OFF_837 to a low voltage level at the time point t8 (indicating that the processor 100 has completed the shut-down procedure). After the shut-down procedure is completed at the time point t8 and the first predefined period T1 has elapsed, it may be confirmed that the processor 100 completely enters the OFF-state (CPU_state is "OFF"). Therefore, the control circuit 400 lowers the enable signal Main_DC_EN to a low voltage level at a time point t9 after the first predefined period T1, so that the first converter 300 stops providing the first power signal Main_DC to the processor 100. In addition, the reset signal Main_DC_RST is also lowered to a low voltage level at the time point t9.

Then, at time t10, the internal battery 150 stops supplying electrical power P_int, so the input power signal BAT_IN_2 and the second power signal VDD_RTC_3V0 drop to a low voltage level (e.g., 0v (zero volt)) at time t10.

Figure 3:
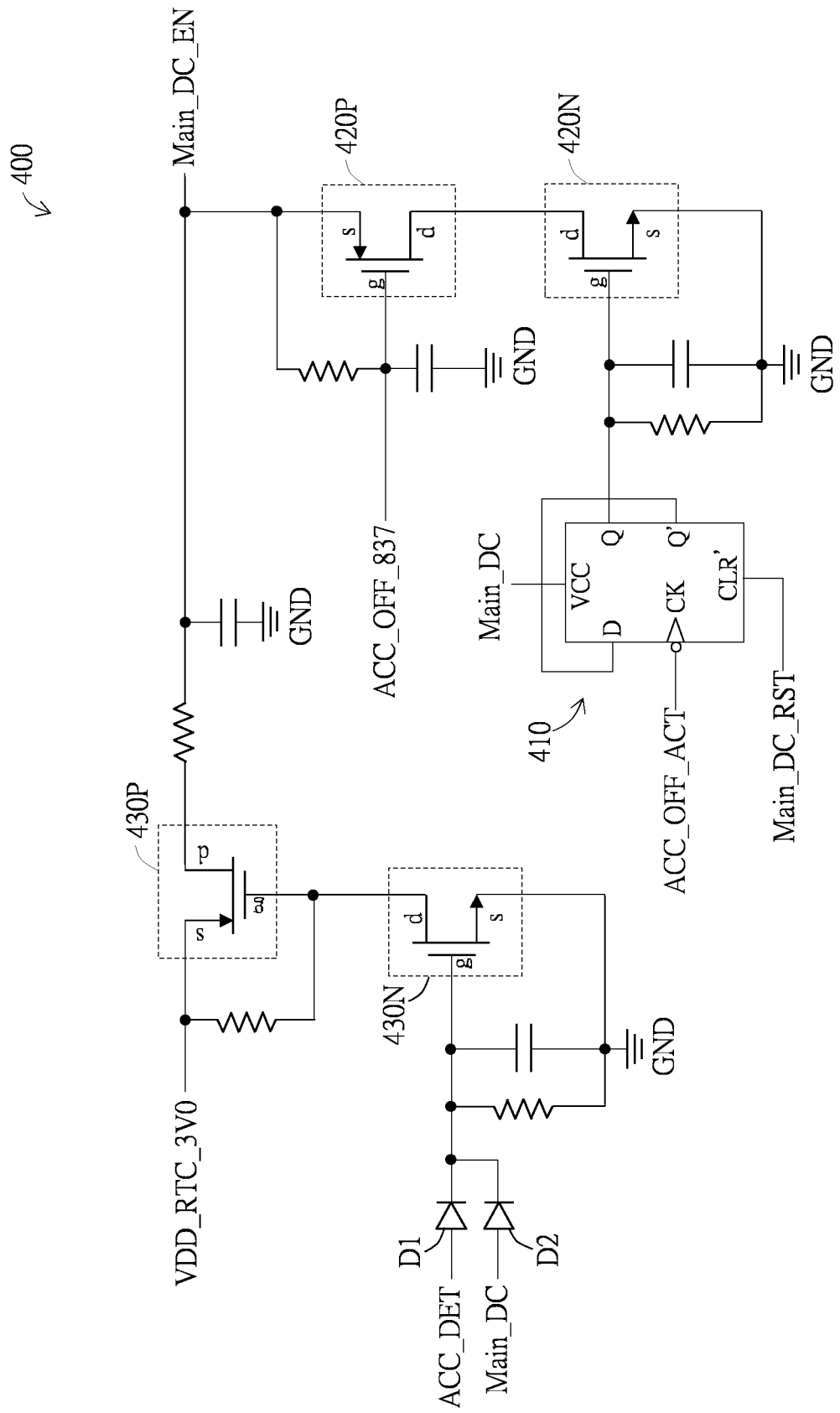
FIG. 3 is a circuit diagram of the control circuit according to an embodiment of the disclosure.

FIG. 3 is a circuit diagram of the control circuit 400 according to an embodiment of the disclosure. Referring to FIG. 3, the control circuit 400 includes a flip-flop (FF) 410, a first N-type transistor 420N, a first P-type transistor 420P, a second N-type transistor 430N, and a second P-type transistor 430P.

The flip-flop 410 is, for example, a "D Flip-Flop". The flip-flop 410 has a reset port CLR', a clock input port CK, a data input port D, a data output port Q, a reverse data output port Q' and a DC power port VCC. The reset port CLR' receives the reset signal Main_DC_RST, the clock input port CK receives the second control signal ACC_OFF_ACT, the data output port Q is coupled to the gate of the first N-type transistor 420N, and the reverse data output port Q' is coupled to the data input port D. And, the DC power port VCC receives the first power signal Main_DC.

The source of the first N-type transistor 420N is coupled to the ground GND, the drain of the first N-type transistor 420N is coupled to the drain of the first P-type transistor 420P, and source of the first P-type transistor 420P is coupled to an output terminal for outputting the enable signal Main_DC_EN. In addition, the gate of the first P-type transistor 420P receives the first control signal ACC_OFF_837.

On the other hand, the source of the second N-type transistor 430N is coupled to the ground GND, and the gate of the second N-type transistor 430N receives the detection signal ACC_DET and the first power signal Main_DC through the diodes D1 and D2, respectively. The drain of the second N-type transistor 430N is coupled to the gate of the second P-type transistor 430P, and the source of the second P-type transistor 430P receives the second power signal VDD_RTC_3V0. In addition, the drain of the second P-type transistor 430P is coupled to the output terminal for outputting the enable signal Main_DC_EN.

In operation, when the internal battery 150 provides electrical power P_int, the input power signal BAT_IN_2 is converted into the second power signal VDD_RTC_3V0 through the second converter 200, so that the second power signal VDD_RTC_3V0 is raised to a high voltage level (e.g., 3v). In addition, when the external power source 160 provides electrical power P_ext, it may be detected that the key start switch of the car is activated, so the detection signal ACC_DET is raised to a high voltage level. The high-level detection signal ACC_DET may turn on the second N-type transistor 430N, and the turned-on second N-type transistor 430N may pull down the voltage level of the gate of the second P-type transistor 430P to the low voltage level of the ground GND, hence the second P-type transistor 430P may be turned on. Accordingly, the high-voltage-level second power signal VDD_RTC_3V0 may be provided as the high-voltage-level enable signal Main_DC_EN through the turned-on second P-type transistor 430P.

Furthermore, when the external power source 160 provides the electrical power P_ext, the input power signal BAT_IN_2 is converted into the first power signal Main_DC through the first converter 300, so that the first power signal Main_DC is raised to a high voltage level (e.g., 3.3v). The high-voltage-level first power signal Main_DC is provided to the flip-flop 410 through the DC power port VCC, and when the reset signal Main_DC_RST is raised to a high voltage level, the reset signal Main_DC_RST may reset the data output port Q of the flip-flop 410 to low voltage level, so that the low voltage level from the data output port Q may turn off the first N-type transistor 420N. Therefore, the output terminal for outputting the enable signal Main_DC_EN will not be conducted to the ground GND, and the enable signal Main_DC_EN may be maintained at high voltage level according to the second power signal VDD_RTC_3V0 with high voltage level.

On the other hand, when the external power source 160 stops supplying the electrical power P_ext, the processor 100 enters the shut-down procedure, and the processor 100 lowers the second control signal ACC_OFF_ACT to a low voltage level. The second control signal ACC_OFF_ACT with dropped voltage level, may trigger the flip-flop 410, so that the signal received by the data input port D of the flip-flop 410 is transmitted to the data output port Q, and the data output port Q is raised to a high voltage level to turn on the first N-type transistor 420N. Moreover, when the processor 100 has completed the shut-down procedure, the processor 100 lowers the first control signal ACC_OFF_837 to a low voltage level, and the first control signal ACC_OFF_837 with low voltage level may turn on the first P-type transistor 420P. At this time, both the first N-type transistor 420N and the first P-type transistor 420P are turned on, and the output terminal of the enable signal Main_DC_EN may be conducted to the ground GND through the first N-type transistor 420N and the first P-type transistor 420P. Therefore, the enable signal Main_DC_EN is pulled down to a low voltage level.

In view of the above, when the internal battery 150 provides the electrical power Pint and the external power source 160 provides the electrical power P_ext, the control circuit 400 may, respond to the high-level first power signal Main_DC, the high-level second power signal VDD_RTC_3V0 and the high-level detection signal ACC_DET, output a high-level enable signal Main_DC_EN, and the enable signal Main_DC_EN is stably maintained at a high voltage level. Accordingly, the first converter 300 may be controlled to provide the first power signal Main_DC to the processor 100. On the other hand, when the external power source 160 stops supplying the electrical power P_ext and the processor 100 completes the shut-down procedure, the control circuit 400 may pulled down the enable signal Main_DC_EN in response to the first control signal ACC_OFF_837 with low voltage level and the second control signal ACC_OFF_ACT with low voltage level. Accordingly, the first converter 300 may be controlled to stop providing the first power signal Main_DC to the processor 100.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. An electronic device, comprising:
   an internal battery;
   a first converter, for converting an electrical power provided by the internal battery or an electrical power provided by an external power source into a first power signal;
   a processor, operating in a ON-state or switching to a OFF-state according to the first power signal; and
   a control circuit, for controlling the first converter to make the first converter selectively provide the first power signal to the processor, and the control circuit is configured to:
      provide an enable signal to control the first converter, wherein when the enable signal has a high voltage level, the first converter provides the first power signal to the processor; and
      when the external power source does not provide the electrical power and the processor enters a shut-down procedure, and a first predefined period elapses after the shut-down procedure is completed, lower the enable signal to a low voltage level, wherein when the shut-down procedure is completed, the processor switches to the OFF-state.

2. The electronic device according to claim 1, wherein the processor is configured to:
   operate in the ON-state when the first converter provides the first power signal; and
   switches to the OFF-state when the first converter does not provide the first power signal.

3. The electronic device according to claim 1, wherein the control circuit is further configured to:
   when the external power source provides the electrical power, raise the enable signal to a high voltage level;
   wherein, when the enable signal has a high voltage level, the processor enters a boot procedure.

4. The electronic device according to claim 1, wherein the processor is further configured to:
   provide a first control signal to the control circuit;
   wherein, when the first predefined period elapses after the first control signal is lowered to a low voltage level, the control circuit lowers the enable signal to a low voltage level.

5. The electronic device according to claim 4, wherein the processor is further configured to:
   when the boot procedure is completed, raise the first control signal to a high voltage level; and
   when the shut-down procedure is completed, lower the first control signal to a low voltage level.

6. The electronic device according to claim 5, wherein the processor is further configured to:
   provide a second control signal to the control circuit;
   when the boot procedure is completed, raise the second control signal to a high voltage level; and
   when entering to the shut-down procedure, lower the second control signal to a low voltage level.

7. The electronic device according to claim 6, wherein the control circuit is further configured to:
   when a detection signal associated with the external power source has a high voltage level, raise the enable signal to a high voltage level;
   wherein, when the external power source provides the electrical power, the detection signal has a high voltage level.

8. The electronic device according to claim 7, wherein the processor is further configured to:
   when a second predefined period elapses after the detection signal is lowered to a low voltage level, lower the second control signal to a low voltage level;
   wherein, when the external power source does not provide the electrical power, the detection signal has a low voltage level.

9. The electronic device according to claim 8, further comprising:
   a second converter, for selectively receiving the electrical power provided by the internal battery and the electrical power provided by the external power source, and converting the received electrical power into a second power signal;
   wherein, when the internal battery provides the electrical power, the control circuit maintains the enable signal at a high voltage level according to the second power signal.

10. The electronic device according to claim 9, wherein the voltage level of the electrical power provided by the external power source ranges from 4.2v to 5v, the voltage level of the electrical power provided by the internal battery is 3.7v, the voltage level of the first power signal provided by the first converter is 3.3v, and the voltage level of the second power signal provided by the second converter is 3v.

11. The electronic device according to claim 10, further comprising:
   a signal generator, for generating a reset signal according to the first power signal;
   wherein, the control circuit raises the enable signal to a high voltage level according to a rising edge of the reset signal.

12. The electronic device according to claim 11, wherein the control circuit comprises:
   a flip-flop, having a reset port to receive the reset signal;
   a first N-type transistor, having a gate coupled to a data output port (Q-port) of the flip-flop, and having a source coupled to a ground; and a first P-type transistor, coupled between the first N-type transistor and an output terminal which outputs the enable signal;

wherein, the reset signal of a high voltage level resets the flip-flop, and the Q-port is reset to a low voltage level to turn off the first N-type transistor, and the enable signal is maintained at a high voltage level.

13. The electronic device according to claim 12, wherein the flip-flop further comprising:

a data input port (D-port);

a reverse data output port (Q'-port), coupled to the D-port; and a clock input port (CK-port), for receiving the second control signal;

wherein, the second control signal of a low voltage level triggers the flip-flop, and the Q-port is raised to a high voltage level to turn on the first N-type transistor.

14. The electronic device according to claim 13, wherein the gate of the first P-type transistor receives the first control signal, the first P-type transistor is turned-on when the first control signal is lowered a low voltage level, and the enable signal is pulled down to a low voltage level through the turned-on first P-type transistor and the turned-on first N-type transistor.

15. The electronic device according to claim 12, wherein the control circuit further comprising:

a second N-type transistor, having a gate to receive the detection signal or the first power signal, and having a source coupled to the ground; and a second P-type transistor, having a source to receive the second power signal, and having a gate coupled to the ground through the second N-type transistor;

wherein, when the detection signal or the first power signal is raised to a high voltage level, both the second N-type transistor and the second P-type transistor are turned on, and the second power signal is provided as the enable signal through the turned-on second P-type transistor.

* * * * *